United States Patent [19]

Benwell

[11] Patent Number: 5,214,241
[45] Date of Patent: May 25, 1993

[54] PRESSURE STABILIZED RADIO FREQUENCY GASKET

[75] Inventor: Bruce T. Benwell, Stafford, Va.

[73] Assignee: The United States of America as represented by the Secretary of the Army, Washington, D.C.

[21] Appl. No.: 762,992

[22] Filed: Sep. 20, 1991

[51] Int. Cl.$^5$ .......... H05K 9/00; B65D 53/06
[52] U.S. Cl. .......... 174/35 GC; 277/34; 277/34.6; 220/228; 220/239; 174/35 R
[58] Field of Search .......... 220/217, 225, 228, 239; 277/34, 34.3, 34.6; 174/35 R, 35 MS, 35 GC

[56] References Cited

U.S. PATENT DOCUMENTS

| | | | |
|---|---|---|---|
| 2,832,618 | 4/1958 | Knoll et al. | 277/34.3 |
| 3,764,037 | 10/1973 | Rothrock | 277/34.3 |
| 3,769,750 | 11/1973 | Mayer et al. | 49/477 |
| 4,177,353 | 12/1979 | McCormack | 174/35 |
| 4,260,164 | 4/1981 | Baker et al. | 277/34 |
| 4,371,175 | 2/1983 | Van Dyk, Jr. | 277/34 |
| 4,399,317 | 8/1983 | Van Dyk, Jr. | 174/35 |
| 4,722,151 | 2/1988 | Westwell | 49/477 |

Primary Examiner—Leo P. Picard
Assistant Examiner—Bot L. Ledynh
Attorney, Agent, or Firm—Saul Elbaum; Jason M. Shapiro

[57] ABSTRACT

A radio frequency gasket assembly having a flexible hollow tube enveloped by a conductive layer, and filled with a compressible fluid, or a combination of both compressible and incompressible fluids. In one embodiment thereof, the undeformed gasket is filled completely with a compressible fluid, such as air. When the gasket is compressed, a portion of the fluid is allowed to collect in a spring-loaded reservoir, maintaining at all times a substantially constant internal pressure. When the compressive force is removed, the collected fluid re-enters the gasket, which may then assume its original undeformed profile. In another embodiment thereof, the undeformed gasket is filled with a mixture of both compressible and incompressible fluids. When the gasket is compressed, a portion of the compressible fluid is evacuated or collected in a spring-loaded reservoir or the like, maintaining at all times a substantially constant internal pressure. When the compressive force is removed, an equal amount of compressible fluid is re-introduced into the gasket, which may then assume its original undeformed profile.

6 Claims, 6 Drawing Sheets

PRESSURE STABILIZED RADIO FREQUENCY GASKET

GOVERNMENTAL INTEREST

The invention described herein may be manufactured, used and licensed by or for the U.S. Government for governmental purposes without the payment to us of any royalties thereon.

BACKGROUND OF THE INVENTION

This invention relates to the field of radio frequency (RF) shielding, and more particularly to an electrically conductive gasket for use between adjacent conductive sections of a shielded enclosure.

A common problem associated with shielded enclosures is the loss of shielding effectiveness at the gap between the door and the door frame. Several approaches to providing a continuous electrically conductive medium between the door and the door frame have been employed in the past.

One approach involves the use of conductive finger stock on the door or door frame of the shielded enclosure. The finger stock is positioned to contact with a knife-edge extension on the opposite surface thereby establishing electrical connection between the two surfaces.

Another common approach involves the use of a wire mesh gasket which is mounted to the doors and hatches of a shielded structure. This comprises a solid polymer core surrounded by several concentric rings of conductive wire mesh. The gasket is made to fit within a channel around the perimeter of the door. As the door is closed, the gasket is compressed between the door channel and the frame of the shelter, thereby providing the necessary contact pressure between the gasket and the mating surfaces to establish electrical conductivity. The core should maintain a nearly constant pressure between the mating surfaces regardless of how many times it has been deformed in this manner.

With repeated use, however, the gasket core suffers permanent deformation, or "set", and fails to provide a constant pressure between the mating surfaces. In addition, gasket set frustrates the "cleaning action" experienced when a gasket is compressed onto a small bead, such as that found on a mating surface. Ordinarily, the sides of the bead rub against the gasket surface and scrape off oxides and other impurities which might impair electrical contact.

Experience has shown that the Shielding Effectiveness of wire mesh gaskets with polymer cores degrades rapidly after only a few months, after which time the permanent deformation adversely affects the gasket's ability to provide adequate shielding.

A discussion of the disadvantages inherent in these approaches can also be found in U.S. Pat. No. 4,177,353 (1979) to McCormack. McCormack teaches an inflatable tube with a sleeve or coating of conducting material for use as an RF gasket. The tube is fixedly mounted about the entire periphery of the door frame and is inflated with compressed air or some other compressed gas when the door is closed so as to provide electrical contact between the door and the shielded structure. The gasket must be deflated to either open or close the door.

A similar solution is proposed by Van Dyk, U.S. Pat. No. 4,371,175 (1983). A flattened inflatable elastomeric tube is disposed along the periphery of a conductive section of the shielded enclosure and provided with a loosely fitting conductive sheath. When the door to the enclosure is closed, the tube is inflated through introduction of a compressed fluid such as air, thereby urging the shielding medium into conductive contact with adjacent sections of the enclosure.

The inflatable gaskets proposed by McCormack and Van Dyk must be deflated to either open or close the door to the enclosure. For this reason large volumes of compressed air or gas are required for operation. This in turn necessitates the use of expensive equipment such as air compressors, and the constant availability of power. Air or gas tanks can be used, but in many applications these exceed size and weight limitations.

In addition, where conductive outer shells are used in conjunction with an elastomeric tubular core, the mesh must be large enough to accommodate the maximum expanded size of the hollow gasket core. Thus, when the gasket is deflated, the outer shell does not reduce in size and will become "baggy" in the gasket channel. This can cause two problems: first, it allows the gasket to pinch, preventing uniform surface conductivity, and second, it prohibits the natural cleansing action which occurs when a snug outer shell is pressed against the bead on the door frame.

SUMMARY OF THE INVENTION

Accordingly, it is an object of the present invention to provide an RF gasket which maintains proper contact pressure between adjacent conductive surfaces without undue inflation of the hollow tubular core thereby increasing operating life.

It is another object of this invention to provide an RF gasket which is substantially insensitive to changes in ambient temperature while maintaining proper contact pressure between adjacent conductive surfaces.

It is a further object of this invention to provide an RF gasket which, in the absence of electrical power, will maintain proper contact pressure between adjacent conductive surfaces.

These objects and others not specifically enumerated are achieved by a gasket structure having a flexible hollow tube enveloped by a conductive layer, and filled with a combination of both compressible and incompressible fluids.

In one embodiment thereof, the undeformed gasket is filled entirely with a compressible fluid, such as air. When the gasket is compressed, a portion of the compressible fluid is allowed to collect in a spring-loaded reservoir or the like, maintaining a substantially constant internal pressure within the gasket. When the compressive force is removed, the collected fluid re-enters the gasket, which may then assume its original undeformed profile.

In another embodiment thereof, the undeformed gasket is filled with a mixture of both compressible and incompressible fluids. When the gasket is compressed, a portion of the compressible fluid is evacuated or collected in a spring-loaded reservoir or the like, maintaining a substantially constant internal pressure within the gasket. When the compressive force is removed, an equal amount of compressible fluid is reintroduced into the gasket, which may then assume its original undeformed profile.

BRIEF DESCRIPTION OF THE DRAWINGS

The preferred embodiments of the present invention will be described with reference to the accompanying drawings.

DESCRIPTION OF THE PREFERRED EMBODIMENTS

The present invention is intended to improve the performance of an RF gasket through the use of internal pressure to stabilize the gasket's shape. This technique is different from the inflatable gaskets described previously in which gas pressure is used to expand the size of the gasket thereby increasing contact pressure. In the present invention only enough pressure is maintained in order to retain the gasket's shape. Therefore, the gasket is not abnormally inflated.

Figure 1:
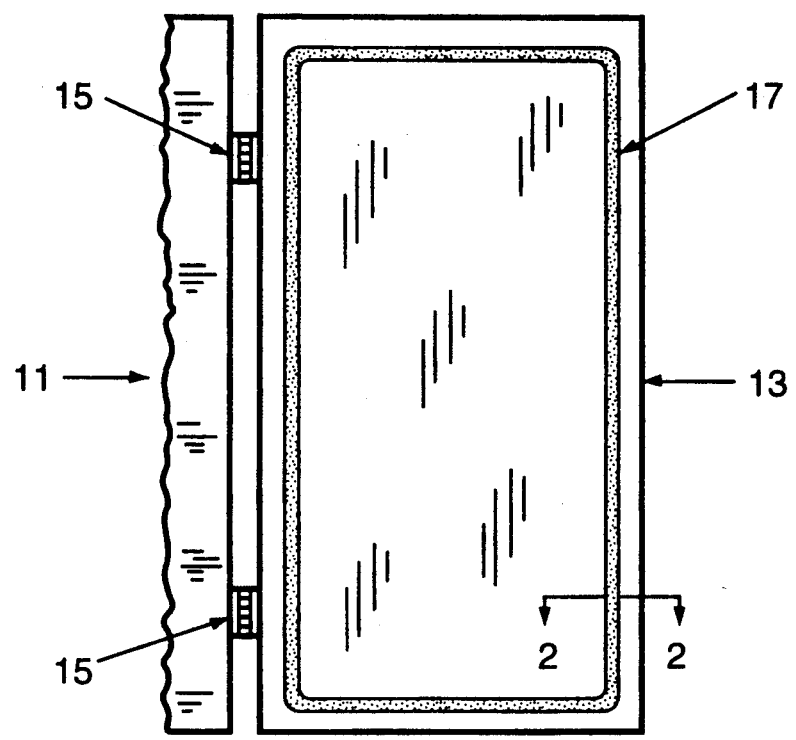
FIG. 1 illustrates a portion of a wall of an electromagnetically shielded enclosure having an opening or door frame closed by a hinged rectangular door having a fluid-filled RF gasket.

Referring to FIG. 1, a section of an opening or door frame 11 is shown as it relates to a door or hatch 13 meant to close that opening. For illustration purposes the door 13 is attached to the door frame 11 with hinges 15. Both the door frame 11 and the door 13 provide electromagnetic shielding. An RF gasket 17 is located around the periphery of the door 13, and may be flush-mounted or positioned within a groove formed in the door 13. When the door 13 is closed against the door frame 11 the gasket 17 is compressed to form a conductive medium between the door 13 and the shielded enclosure.

Figure 2A:
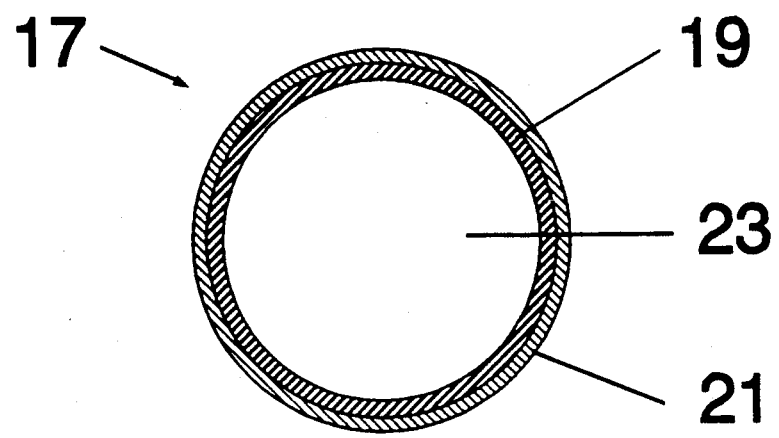
FIGS. 2a and 2b, both taken along line 2—2 of FIG. 1, show two embodiments of a gasket according to the invention and in an undeformed state.
Figure 2B:
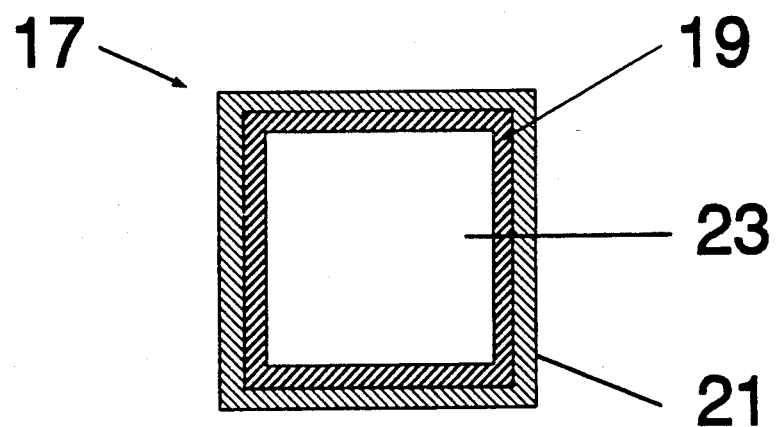

Two geometries of RF gasket 17 are shown in FIGS. 2a and 2b as cross-sections along line 2—2 of FIG. 1. Flexible hollow tubing 19 forms the core of the RF gasket 17. The tubing 19 can be any resilient elastomeric material, but is preferably made of silicon to withstand extreme temperatures. The tubing 19 can be made in one piece, or straight tubing can be cut and joined together with an adhesive. If the tubing 19 is silicon, a silicon adhesive can be used to join the various sections, but most adhesives take a few days to cure fully. It is preferred that the gasket be extruded in one piece to minimize reliability problems during manufacturing and use.

A conductive layer 21 which encases the hollow tubing 19, can be formed by wrapping conductive knitted wire mesh around the tubing 19, or by bringing the tubing 19 into contact with finger stock (not illustrated). Because the wire mesh 21 is woven, it can be turned along a radius to follow the tubular core 19.

Figure 3:
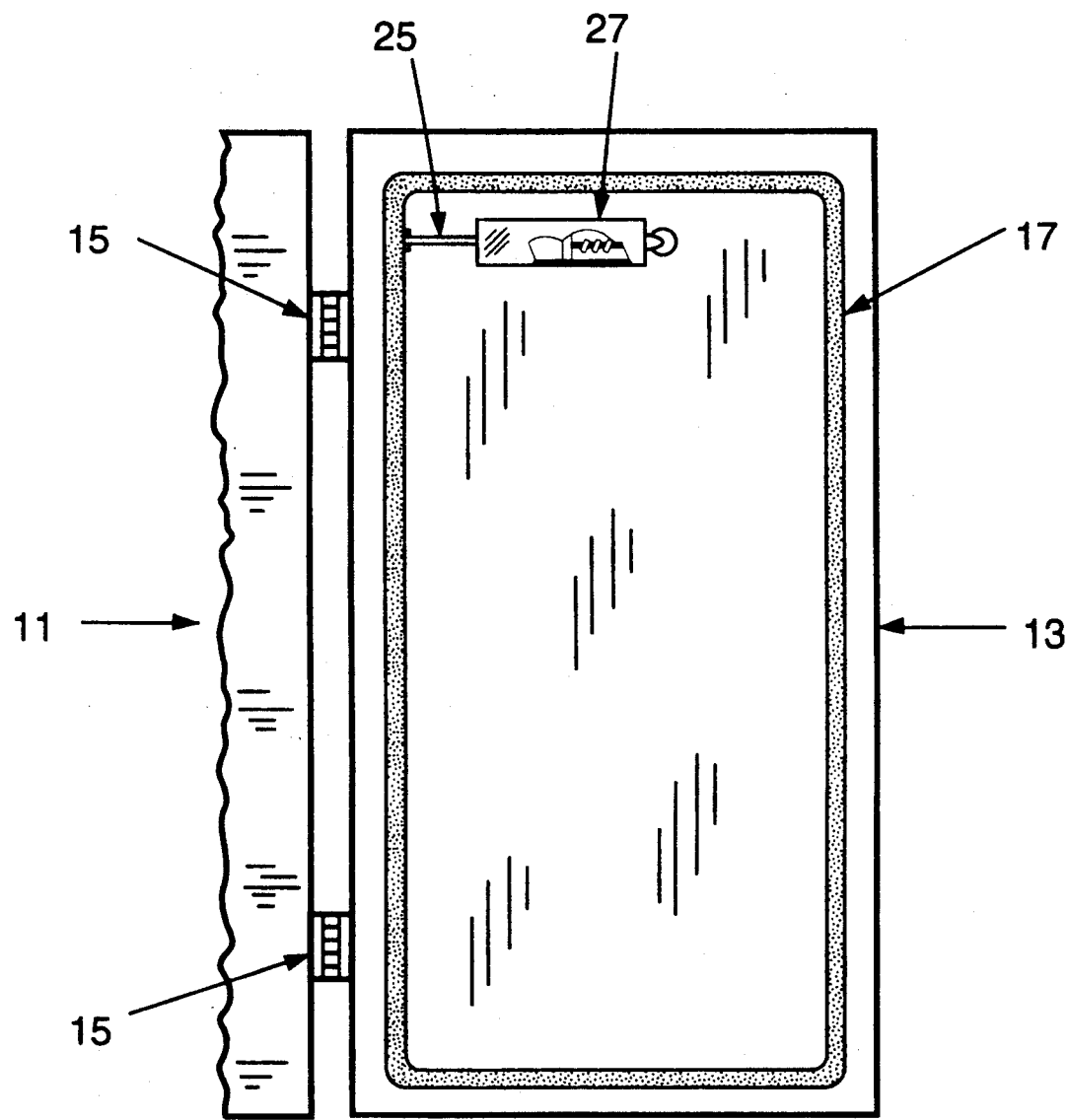
FIG. 3 illustrates a portion of a wall of an electromagnetically shielded enclosure having an opening or door frame closed by a hinged rectangular door having a fluid-filled RF gasket and a spring-loaded reservoir attached thereto.

In one embodiment of the present invention, the undeformed RF gasket 17 is filled with a mixture of both compressible fluids such as air, and incompressible fluids. A bleeder tube 25 feeds into the upper portion of the gasket 17 where the compressible fluid (e.g. air) forms a pocket. Upon compression (i.e. when the door 13 is closed), the compressible fluid will be forced out of the gasket 17, through the bleeder tube 25, and into a spring-loaded reservoir 27 (See FIG. 3). The remaining incompressible fluid 23 maintains proper contact pressure between the gasket 17, the door 13, and the door frame 11. When the compressive force is removed (i.e. the door is opened), the evacuated fluid is returned to the gasket 17 so that it may resume it's undeformed shape. During this process the internal pressure of the gasket 17 is limited to its previous level while undeformed. This minimizes gasket set by reducing fatigue, and promotes the natural cleaning action which is created when the gasket 17 is compressed against the bead of the door frame 11.

Figure 4:
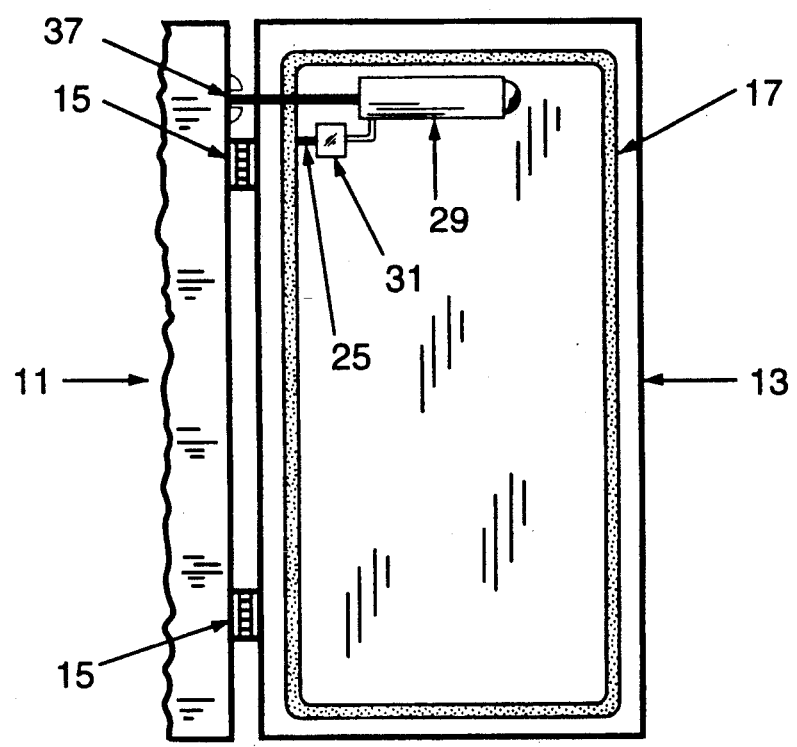
FIG. 4 illustrates a portion of a wall of an electromagnetically shielded enclosure having an opening or door frame closed by a hinged rectangular door having a fluid-filled RF gasket, a release valve, and a mechanical air pump attached thereto.

A mechanical plunger type air pump 29 in conjunction with a release valve 31 may be substituted for the spring-loaded reservoir 27 described above. In one embodiment, illustrated in FIG. 4, the compressible fluid (air) is evacuated from the gasket 17 through a release valve 31 when the door is closed. (The release valve 31 also provides a convenient audio indication that the gasket is performing properly. If the operator cannot hear air being released when the door is closed, then proper pressurization is not occuring.) An air pump 29 is attached to the door 13, and its plunger 37 extends out against the door frame 11 or some other part of the enclosure. When the door 13 is opened, the plunger 37 is pulled, forcing air back into the gasket 17, and restoring the gasket to its original, undeformed shape.

Figure 5:
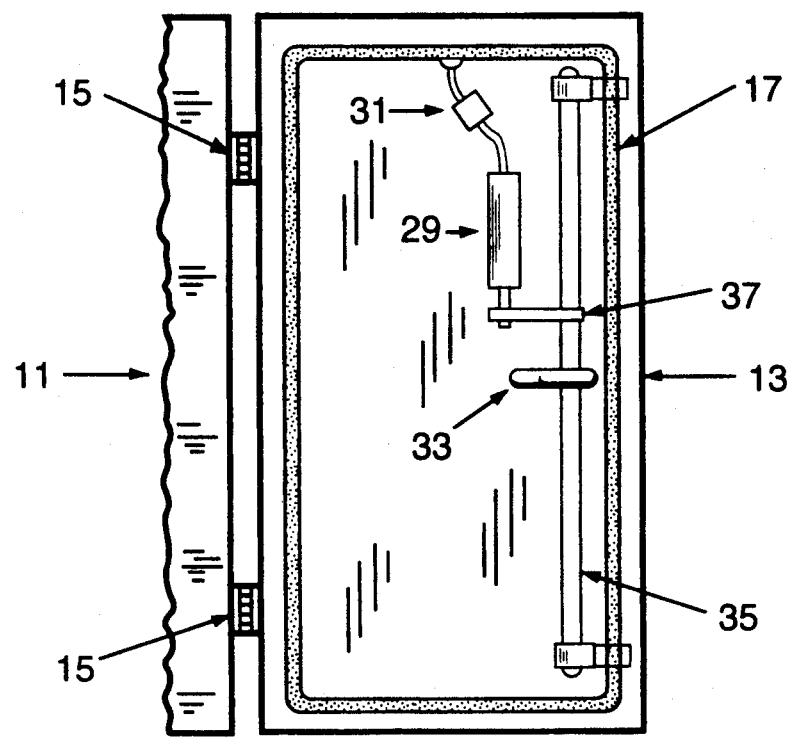
FIG. 5 illustrates a portion of a wall of an electromagnetically shielded enclosure having an opening or door frame closed by a hinged rectangular door having a fluid-filled RF gasket, a release valve, and a mechanical air pump attached to the door opening means.

In another embodiment, illustrated in FIG. 5, the air pump 29 is attached to the door 13, and its plunger 37 is connected to the door latch mechanism 35 in such a way as to pump air back into the gasket 17 when the latch 33 is turned to open the door 13.

Figure 6:
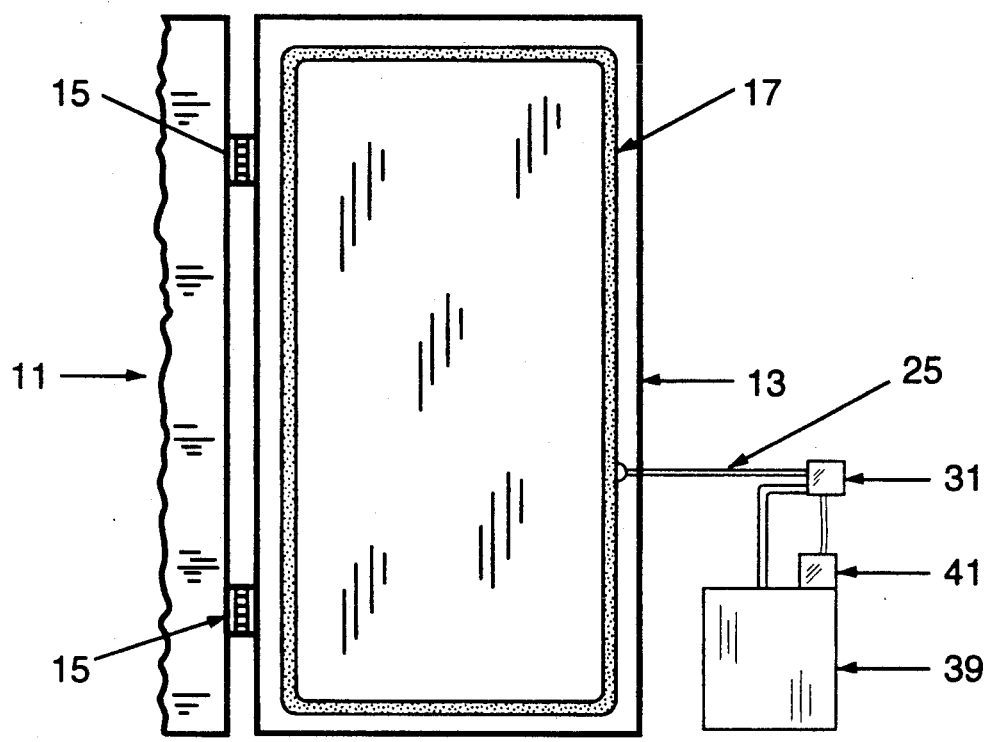
FIG. 6 illustrates a portion of a wall of an electromagnetically shielded enclosure having an opening or door frame closed by a hinged rectangular door having a fluid-filled RF gasket, and a separate regulated air pump with release valve.

FIG. 6 shows an RF gasket 17 used with an air compressor 39, a release valve 31, and a pressure regulated power switch 41. As the pressure deviates from normal, the compressor 39 is turned on to stabilize the pressure. This approach could be used on shielded rooms or enclosures where AC power is always available. However, in the event of power disruption the gasket will perform adequately for short periods of time (i.e. until it develops gasket set in the usual fashion).

In the embodiments described above the gasket 17 is not deformed beyond its normal shape, thus eliminating many of the problems associated with inflatable bladders. It is possible to incorporate existing RF gaskets with a hollow tubular core, thereby preventing catastrophic failure of the gasket assembly if fluid pressure is lost.

While there has been described and illustrated specific embodiments of the invention, it will be obvious that various changes, modifications and additions can be made herein without departing from the field of the invention which should be limited only by the scope of the appended claims.

I claim:

1. An apparatus for providing an electrically conductive seal between two surfaces, said apparatus comprising:

a gasket comprising a flexible hollow tube, a mixture of air and an incompressible fluid contained within said hollow tube, and mans for covering said hollow tube, wherein said covering means envelops said tube and is electrically conductive;

mans for releasing a portion of said air upon compression of said hollow tube;

means for introducing an equal portion of air back into said hollow tube when said hollow tube is no longer under compression, whereby said hollow tube will resume its original undeformed profile, and a substantially constant internal pressure will be maintained at all times within said hollow tube.

2. An apparatus for providing an electrically conductive seal between two surfaces, said apparatus comprising:

a gasket comprising a flexible hollow tube filled with air and means for covering said hollow tube, wherein said covering means envelops said tube and is electrically conductive;

means for releasing a portion of said air upon compression of said hollow tube;

means for introducing an equal portion of air back into said hollow tube when said hollow tube is no longer under compression, whereby said hollow tube will resume its original undeformed profile, and a substantially constant internal pressure will be maintained at all times within said hollow tube.

3. The invention of claim 1 or 2 wherein said gasket is attached to a shielded door of a shielded enclosure, and said means for releasing a portion of said air from, and introducing an equal portion of air back into said gasket is comprised of:

a spring-loaded reservoir attached to said door;

a hollow tube disposed between said gasket and spring loaded reservoir.

4. The invention of claim 1 or 2 wherein said gasket is attached to a shielded door of a shielded enclosure, and said means for releasing a portion of said air from, and introducing an equal portion of air back into said gasket is comprised of:

a mechanical air pump which is attached to said door, wherein said air pump has a plunger which is in contact with said shielded enclosure;

a hollow tube disposed between said gasket and air pump;

a release valve disposed between said gasket and air pump.

5. The invention of claim 1 or 2 wherein said gasket is attached to a shielded door of a shielded enclosure, and said means for releasing a portion of said air from, and introducing an equal portion of air back into said gasket is comprised of:

a mechanical air pump which is attached to said door, wherein said air pump has a plunger which is attached to and operated by the latching means of said door;

a hollow tube disposed between said gasket and air pump;

a release valve disposed between said gasket and air pump.

6. The invention of claim 1 or 2 wherein said gasket is attached to a shielded door of a shielded enclosure, and said means for releasing a portion of said air from, and introducing an equal portion of air back into said gasket is comprised of:

a regulated air supply provided with a power supply and release valve;

a hollow tube disposed between said gasket and regulated air supply.

* * * * *